(12) United States Patent
Chou

(10) Patent No.: US 8,716,742 B2
(45) Date of Patent: May 6, 2014

(54) LIGHT EMITTING DEVICE FOR AC OPERATION

(75) Inventor: Hsi-Yan Chou, Taoyuan County (TW)

(73) Assignee: Interlight Optotech Corporation, Yangmei, Taoyuan County (TW)

( * ) Notice: Subject to any disclaimer, the term of this patent is extended or adjusted under 35 U.S.C. 154(b) by 46 days.

(21) Appl. No.: 13/240,257

(22) Filed: Sep. 22, 2011

(65) Prior Publication Data
US 2012/0235581 A1  Sep. 20, 2012

(30) Foreign Application Priority Data
Mar. 14, 2011  (TW) .............................. 100108494 A

(51) Int. Cl.
H01L 33/00 (2010.01)
H01L 25/04 (2014.01)

(52) U.S. Cl.
CPC ................... *H01L 25/048* (2013.01)
USPC .......................................................... 257/99

(58) Field of Classification Search
CPC .................................................... H01L 25/048
USPC ........................................................ 257/99
See application file for complete search history.

(56) References Cited

U.S. PATENT DOCUMENTS

| 3,548,254 A | 12/1970 | Pahlavan |
| 2009/0294780 A1 * | 12/2009 | Chou et al. ................. 257/88 |

FOREIGN PATENT DOCUMENTS

| EP | 2 500 636 A1 | 9/2012 |
| JP | 2004119631 | 4/2004 |
| JP | 2006332618 | 12/2006 |
| JP | 2009283933 | 12/2009 |
| JP | 2009283933 A * | 12/2009 |
| JP | 2010080796 | 4/2010 |
| JP | 2012094866 | 5/2012 |
| KR | 20110017405 A | 2/2011 |
| WO | 2009146257 A1 | 12/2009 |

OTHER PUBLICATIONS

Annex to the European Search Report completed on Jun. 20, 2012, in corresponding EP Patent Application No. 11 38 2320.

* cited by examiner

*Primary Examiner* — Ajay K Arora
(74) *Attorney, Agent, or Firm* — Muncy, Geissler, Olds & Lowe, P.C.

(57) ABSTRACT

A light emitting device includes a substrate, a plurality of rectifier diodes, and at least one light emitting diode (LED) module. The substrate has a first cavity, a second cavity, and a third cavity formed thereon. The rectifier diodes are arranged in the first cavity and the third cavity respectively. The LED module is arranged in the second cavity. The LED module includes a plurality of LEDs. The light emitting device is capable of rectifying and converting an alternating current (AC) power supply to drive the LEDs to emit light.

11 Claims, 10 Drawing Sheets

LIGHT EMITTING DEVICE FOR AC OPERATION

CROSS-REFERENCE TO RELATED APPLICATIONS

This non-provisional application claims priority under 35 U.S.C. §119(a) on Patent Application No. 100108494 filed in Taiwan, R.O.C. on Mar. 14, 2011, the entire contents of which are hereby incorporated by reference.

BACKGROUND OF THE INVENTION

1. Field of Invention

The disclosure relates to a light emitting device, and more particularly to a light emitting device having at least one light emitting diode (LED) module comprising a plurality of LEDs and disposed on a substrate.

2. Related Art

Rapid progress of technologies results in rapid development for electronic products. LEDs have been widely applied in illumination devices to serve as the light source for illumination.

Due to advantages of being durable and light, and having long service life and low power consumption, the LEDs have become the mainstream of the illumination industry and the semiconductor industry. Generally, the LEDs can be used in illumination devices, backlight modules of liquid crystal displays (LCDs), or light sources of indicating lamps. However, in practice, the current LED light sources can only operate in the condition that direct current (DC) power supply exists. This indicates the LED light source cannot be used in the alternating current (AC) power supplies. Such technical problems limit LED applications.

Accordingly, AC LEDs capable of using an AC power supply have been developed in the industry. Through a design of the architecture of bridge-rectifying, the AC LEDs can directly use an AC power supply for driving. Generally, in the conditions that the AC power supply having positive cycles and a negative cycles, LEDs are partially conducted, and the non-conducted LEDs have to endure a reverse bias voltage. In this case, the LEDs endure the reverse bias voltage alternately, and when the reverse bias voltage is excessively high, a leakage current of the high reverse biased voltage is generated, thereby resulting in breakdown of LED dies or influencing the illumination lifetime of the entire LEDs, and reducing the reliability.

Secondly, as mentioned above, the LEDs driven through bridge rectifying cannot be lighted up simultaneously, that is to say, only ½ LED can be lighted up, such that the payload of the LEDs is significantly reduced, thereby influencing the illumination benefit.

Accordingly, persons in the art are in urgent need of finding solutions to solve the problem that the withstand voltage of the conventional AC LEDs is limited and provide a light emitting device that can endure the commercial power with high voltage input and has high payload.

SUMMARY OF THE INVENTION

Accordingly, the disclosure is a light emitting device, which can solve the problems in the prior art.

The disclosure provides a light emitting device, which comprises a substrate, a plurality of rectifier diodes, and at least one LED module. The substrate has a surface, and has a first cavity, a second cavity, and a third cavity disposed on the surface. The rectifier diodes are disposed in the first cavity and the third cavity. The LED module is disposed in the second cavity, and the LED module comprises a plurality of LEDs.

According to an embodiment of the disclosure, the LEDs in the LED module may be selectively connected in series or in parallel.

According to an embodiment of the disclosure, the rectifier diodes may be evenly arranged in the first cavity and the third cavity.

According to an embodiment of the disclosure, one of the first cavity and the third cavity further comprises a plurality of sub-cavities, and each sub-cavity is for accommodating each rectifier diode. Each sub-cavity may be separated from one another by a protruding portion, and a conductive wire for connecting each rectifier diode penetrates the protruding portion.

According to an embodiment of the disclosure, each sub-cavity may be separated from one another by two isolation parts, and a conductive wire for connecting each rectifier diode crosses over the isolation parts.

According to an embodiment of the disclosure, the light emitting device may comprises a plurality of the LED modules, in which each LED module comprises the LEDs, and the LED modules are arranged in the second cavity in a matrix.

According to an embodiment of the disclosure, the rectifier diodes comprise a first rectifier diode, a second rectifier diode, a third rectifier diode, and a fourth rectifier diode. The first rectifier diode is connected to the second rectifier diode in series. The third rectifier diode is connected to the fourth rectifier diode in series. A first AC node is defined between the first rectifier diode and the second rectifier diode, while a second AC node is defined between the third rectifier diode and the fourth rectifier diode. The first AC node and the second AC node receives an AC power supply. The AC power supply received at the first AC node and the second AC node is rectified as a direct current (DC) power supply by the rectifier diodes, to drive at least one LED module to emit light According to an embodiment of the disclosure, the LED modules comprise a first LED module, a second LED module, a third LED module, and a fourth LED module. The first LED module is electrically connected to the third LED module, the second LED module is electrically connected to the fourth LED module, the second rectifier diode, and the fourth rectifier diode, and the third LED module is electrically connected to the first LED module, the first rectifier diode, and the third rectifier diode.

According to an embodiment of the disclosure, at least one bottom conductive wire layer, at least one top conductive wire layer, and at least one middle conductive wire layer are further formed within the substrate. The middle conductive wire layer is formed between the bottom conductive wire layer and the top conductive wire layer. The top conductive wire layer comprises a first top conductive wire, a second top conductive wire, a third top conductive wire, and a fourth top conductive wire. The middle conductive wire layer comprises a first middle conductive wire and a second middle conductive wire. The second rectifier diode and the third rectifier diode are connected to an AC power supply through the bottom conductive wire layer respectively. The first LED module and the second LED module are electrically connected to the third LED module and the fourth LED module through the first top conductive wire and the fourth top conductive wire. The first rectifier diode and the third rectifier diode are electrically connected to the second rectifier diode and the fourth rectifier diode through the first middle conductive wire and the second middle conductive wire respectively, in which the second LED module and the third LED module are further electrically connected to the second rectifier diode and the fourth rectifier diode, and the first rectifier diode and the third rectifier diode through the second top conductive wire layer and the third top conductive wire layer respectively.

According to an embodiment of the disclosure, the rectifier diodes and the LED modules may be configured in the same cavity on the substrate simultaneously, or directly configured on the substrate.

According to an embodiment of the disclosure, a material of the substrate may be low-temperature cofired ceramics (LTCC).

According to an embodiment of the disclosure, the LEDs may be installed on the substrate through wire bonding or flip chip bonding.

In view of the above, in the light emitting device of the disclosure, the AC power supply outputs a DC power supply after being rectified by the rectifier diodes, so as to drive the LED modules to emit light.

Secondly, in the light emitting device of the disclosure, the LED module may selectively comprise a plurality of LEDs connected in series or in parallel, such that the withstand voltage of the light emitting device is improved, and compared with the conventional light emitting device, a better payload can be achieved.

BRIEF DESCRIPTION OF THE DRAWINGS

The disclosure will become more fully understood from the detailed description given herein below for illustration only, and thus are not limitative of the disclosure, and wherein.

DETAILED DESCRIPTION OF THE INVENTION

The detailed features and advantages of the disclosure are described below in great detail through the following embodiments, and the content of the detailed description is sufficient for persons skilled in the art to understand the technical content of the disclosure and to implement the disclosure there accordingly. Based upon the content of the specification, the claims, and the drawings, persons skilled in the art can easily understand the relevant objectives and advantages of the disclosure.

Figure 1A:
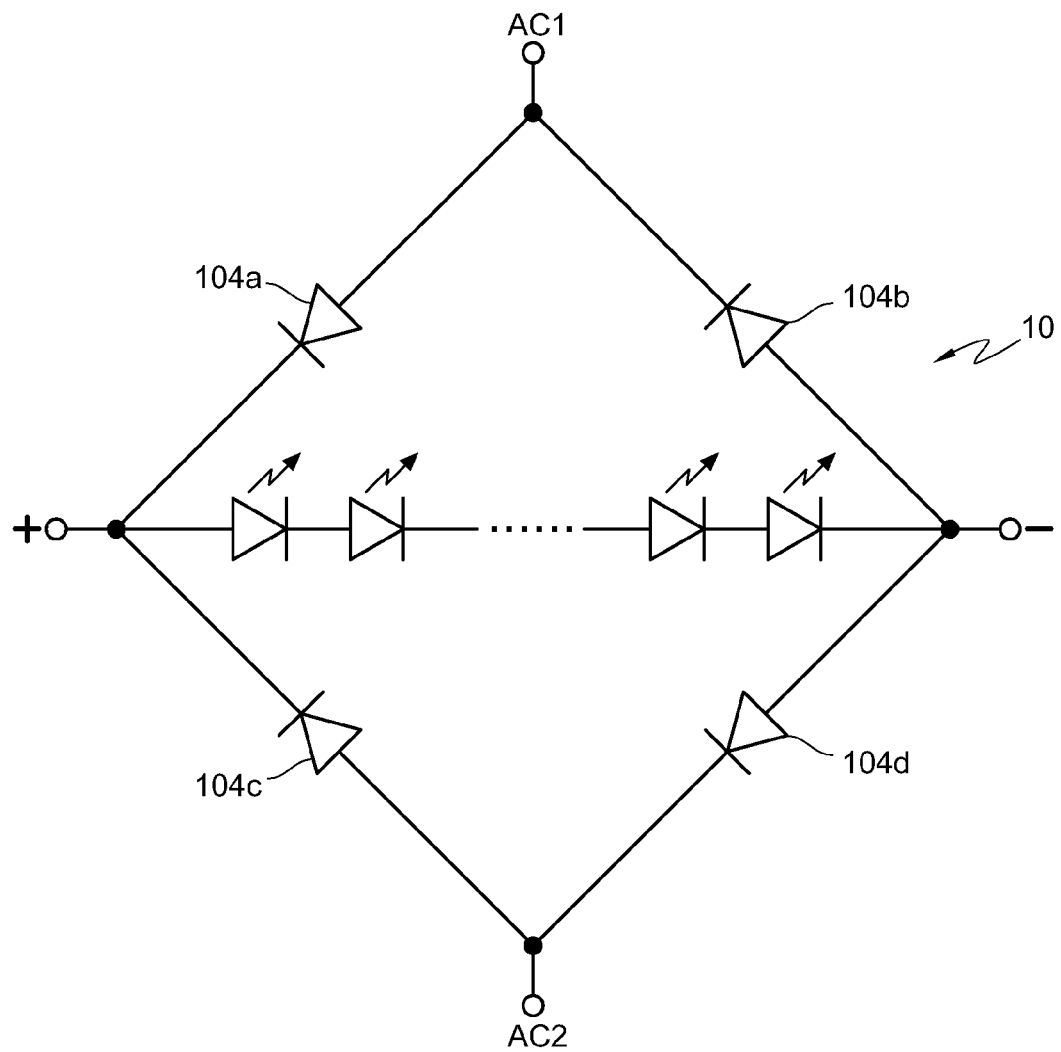
FIG. 1A is an equivalent circuit diagram of a light emitting device according to an embodiment of the disclosure.
Figure 1B:
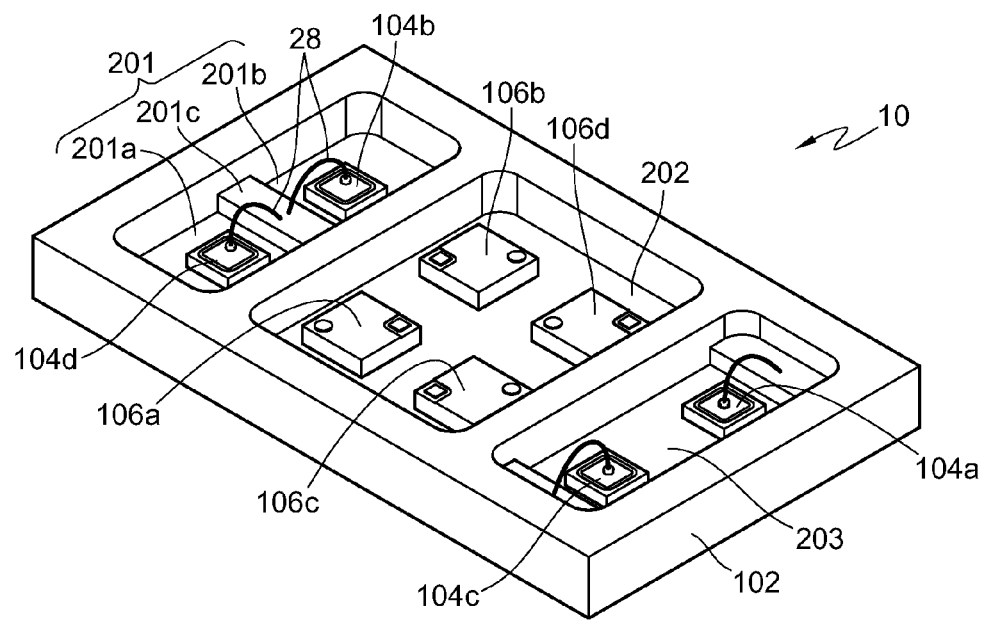
FIG. 1B is a schematic structural view of the light emitting device in FIG. 1A.

FIG. 1A is an equivalent circuit diagram of a light emitting device according to an embodiment of the disclosure, and FIG. 1B is a schematic structural view of the light emitting device in FIG. 1A, in which a light emitting device 10 is adapted to an AC power supply, and is driven by a rectified AC power supply (that is, a DC power supply) and emits light. In order to simplify the drawings, features of some element wires are omitted in FIG. 1B, and the detailed connection and features of the light emitting device 10 of the disclosure are described in detail with reference to FIGS. 2A to 2C.

The light emitting device 10 comprises a substrate 102, in which a material of the substrate 102 may be LTCC, silicon, HTCC $Al_2O_3$, or other metal materials with reliable insulating materials. The substrate 102 has a plurality of cavities opened on a surface thereof, in which the cavities comprise a first cavity 201, a second cavity 202, and a third cavity 203. The first cavity 201, the second cavity 202, and the third cavity 203 are separated from one another, and the second cavity 202 is formed between the first cavity 201 and the third cavity 203. In this embodiment, the first cavity 201 and the third cavity 203 are defined as a first configuration area, and the second cavity 202 is defined as a second configuration area, such that the first configuration area is used for accommodating rectifier diodes, and the second configuration area is used for accommodating LED modules.

The first rectifier diode 104a, the second rectifier diode 104b, the third rectifier diode 104c, and the fourth rectifier diode 104d are disposed in the first cavity 201 and the third cavity 203. According to the embodiments of the disclosure, the first rectifier diode 104a, the second rectifier diode 104b, the third rectifier diode 104c, and the fourth rectifier diode 104d may be evenly disposed in the first cavity 201 and the third cavity 203. That is to say, the second rectifier diode 104b and the fourth rectifier diode 104d may be located in the first cavity 201, and the first rectifier diode 104a and the third rectifier diode 104c may be located in the third cavity 203.

The first cavity 201 further comprises a protruding portion 201c protruding thereon. The protruding portion 201c is used for dividing the first cavity 201 into two sub-cavities 201a and 201b, such that the sub-cavities 201a and 201b are used for accommodating the fourth rectifier diode 104d and the second rectifier diode 104b respectively. In this embodiment, the first cavity 201, the second cavity 202, the third cavity 203, and the sub-cavities 201a and 201b may be formed through an etching process on the substrate 102, that is to say, the protruding portion 201c is naturally formed through an etching step of the sub-cavities 201a and 201b, and the material is the same as that of the substrate 102, for example, an insulating material such as LTCC. In other embodiments of the disclosure, the cavities may also be formed by configuring isolation parts (or referred to as isolation walls) on the substrate 102, to decrease the complexity of the process (described in detail in the following). A conductive wire 28 is electrically connected to the second rectifier diode 104b and the fourth rectifier diode 104d, and penetrates the protruding portion 201c, so as to be connected to the conductive wires in FIGS. 2A to 2C. Herein, when the light emitting device 10 is electrically connected to a high-voltage input power supply, the protruding portion 201c may be considered as a voltage-resistant portion, and is used for separating the second rectifier diode 104b and the fourth rectifier diode 104d, and thus the light emitting device 10 of the disclosure may have a high voltage withstand capability.

The second cavity 202 has a first LED module 106a, a second LED module 106b, a third LED module 106c, and a fourth LED module 106d therein. The first LED module 106a, the second LED module 106b, the third LED module 106c, and the fourth LED module 106d are formed by a plurality of LEDs. The LEDs may be installed on the substrate 102 through wire bonding or flip chip bonding. Thus, in the light emitting device 10 of the disclosure, in the subsequent packaging process, a package resin (for example, epoxy resin) is filled in the first cavity 201, the second cavity 202, and the third cavity 203, to complete the entire packaging structure of the rectifier diodes and the LEDs.

In another embodiment of the disclosure, the second cavity 202 may further form a plurality of sub-cavities, for accommodating the LED modules respectively. In this embodiment, a structure of four cavities, five cavities, or more cavities may be formed.

It should be noted that, the light emitting device 10 of the disclosure comprises four LED modules (comprising the first LED module 106a, the second LED module 106b, the third LED module 106c, and the fourth LED module 106d) in the second cavity 202, and the LED modules are arranged in the second cavity 202 in a matrix, as description of an embodiment. The number of the LED modules may be, but is not limited to, four, the designer can design the number according to the voltage withstand specification of the actual light emitting device, and the number of the LED modules is not used to limit the scope of the disclosure.

Figure 1C:
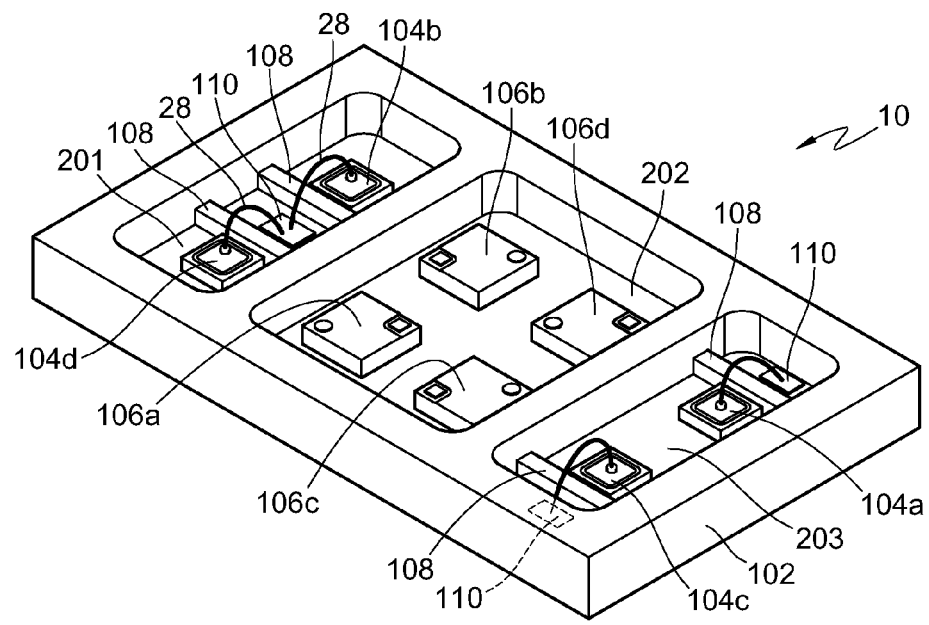
FIG. 1C is a schematic structural view of the light emitting device in FIG. 1A.

Secondly, in an embodiment, in order to simplify the fabrication process of the protruding portion 201c, FIG. 1C shows another embodiment of the light emitting device in FIG. 1A. As shown in FIG. 1C, in order to replace the protruding portion 201c, the light emitting device 10 may comprise at least one isolation part 108 for separating the rectifier diodes and an electrical contact 110. In this structure, the conductive wire 28 is separated by the isolation part 108, crosses over the top of the isolation part 108 and connects the electrical contact 110 to the second rectifier diode 104b and the fourth rectifier diode 104d. Similarly, the first rectifier diode 104a and the third rectifier diode 104c are also separated by the isolation part 108 and electrically connected to the electrical contact 110. The material of the isolation part 108 may be, but is not limited to, silica ($SiO_2$) glass. Therefore, in the light emitting device 10 according to this embodiment, the protruding portion 201c in FIG. 1B is replaced by the additionally configured isolation part 108, such that the light emitting device has the voltage withstand effect, and the complexity of the process is decreased.

Figure 2A:
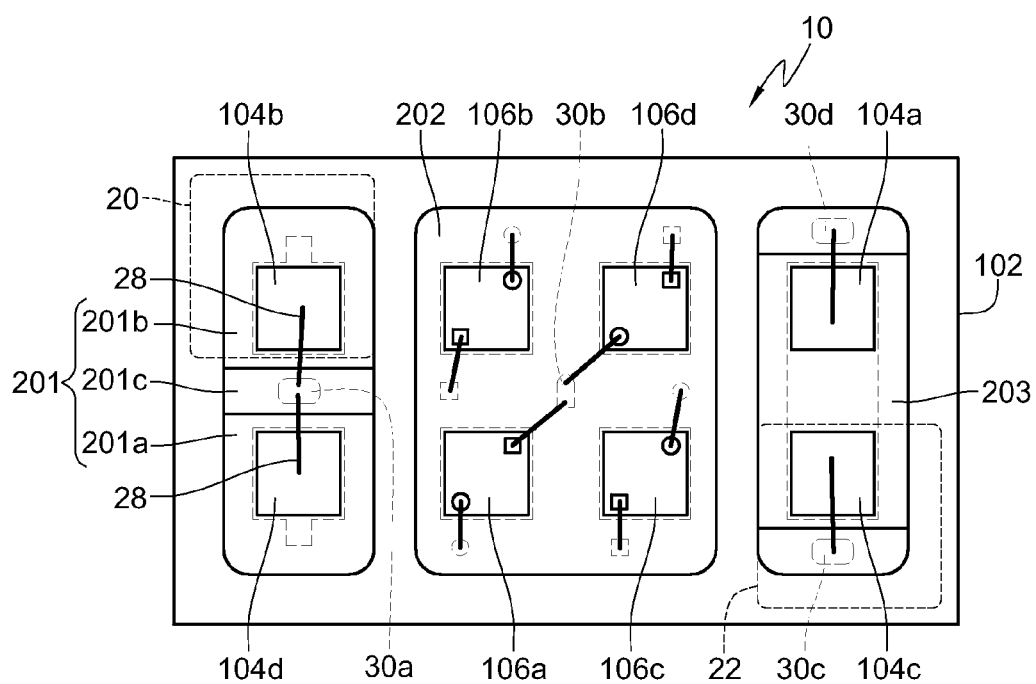
FIG. 2A is a schematic layout view of bottom conductive wire layers of the light emitting device in FIG. 1B.
Figure 2B:
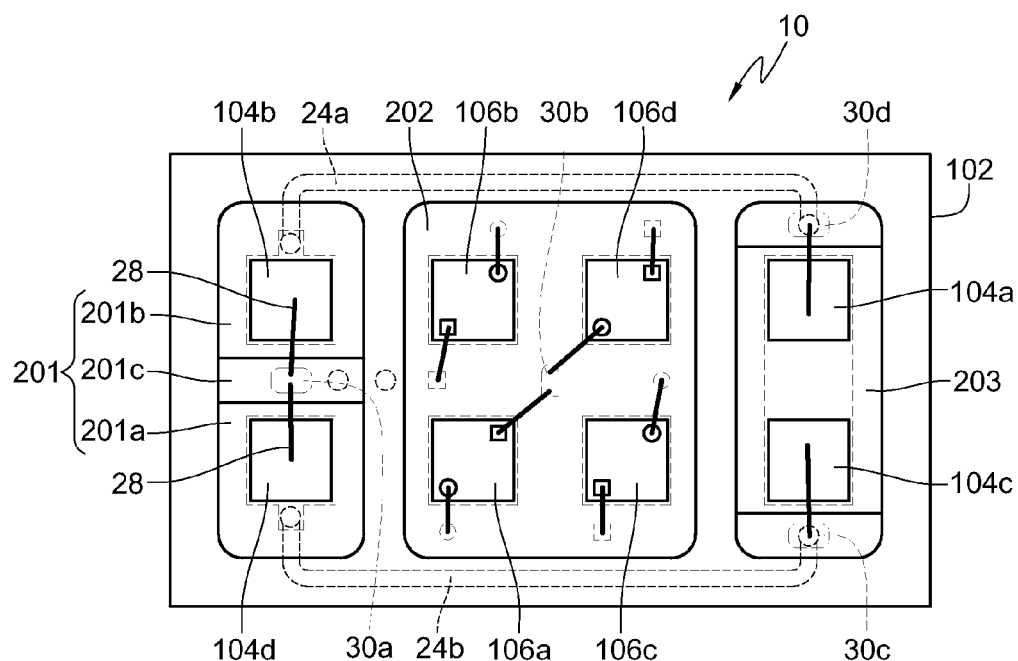
FIG. 2B is a schematic layout view of middle conductive wire layers of the light emitting device in FIG. 1B.
Figure 2C:
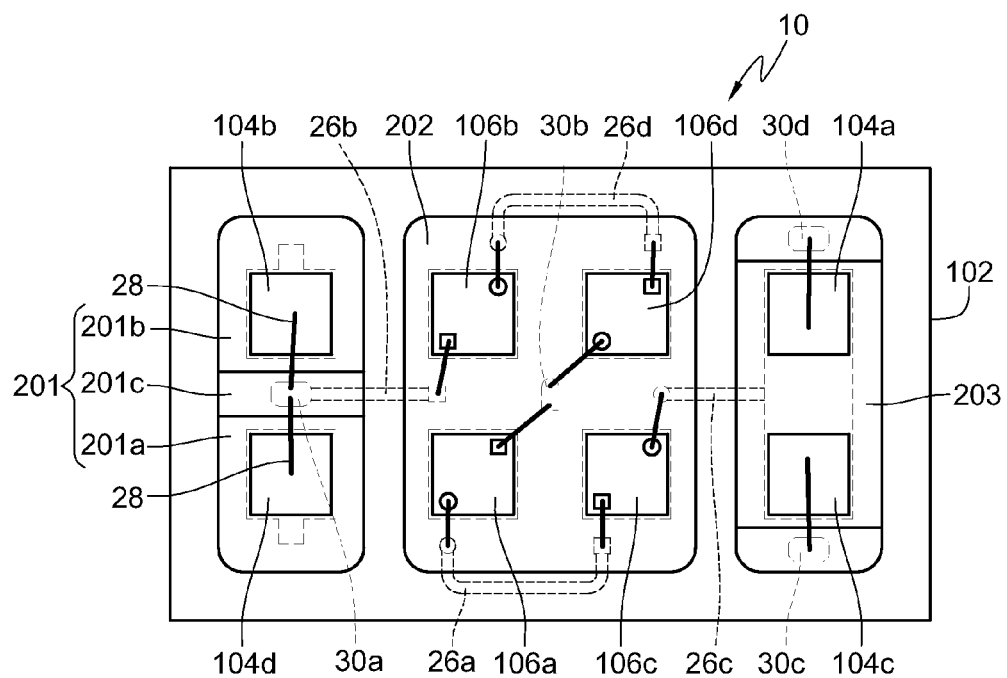
FIG. 2C is a schematic layout view of top conductive wire layers of the light emitting device in FIG. 1B.

FIGS. 2A to 2C are schematic layout views of conductive wires of layers of the light emitting device of the disclosure in FIG. 1B. The conductive wires in FIG. 2A to 2C are located at blocks between the bottom of the substrate 102 and the cavities, that is to say, the conductive wires are embedded in the body of the substrate 102. Particularly, the wires in FIG. 2A are located at a bottom layer of body of the substrate 102, the wires in FIG. 2C are located at a top layer of the body of the substrate 102, and the wires in FIG. 2B are located at a middle layer of the body of the substrate 102, that is, between the bottom layer and the top layer. A first via 30a, a second via 30b, a third via 30c, and a fourth via 30d penetrate the bottom layer, the middle layer, and the top layer, such that the wires at the layers of the body of the substrate 102 electrically communicate with one another, in which the first via 30a is used for electrically connecting the second rectifier diode 104b and the fourth rectifier diode 104d, the second via 30b is used for electrically connecting the first LED module 106a and the fourth LED module 106d, the third via 30c and the fourth via 30d are used for electrically connecting the third rectifier diode 104c and the first rectifier diode 104a respectively.

Figure 3A:
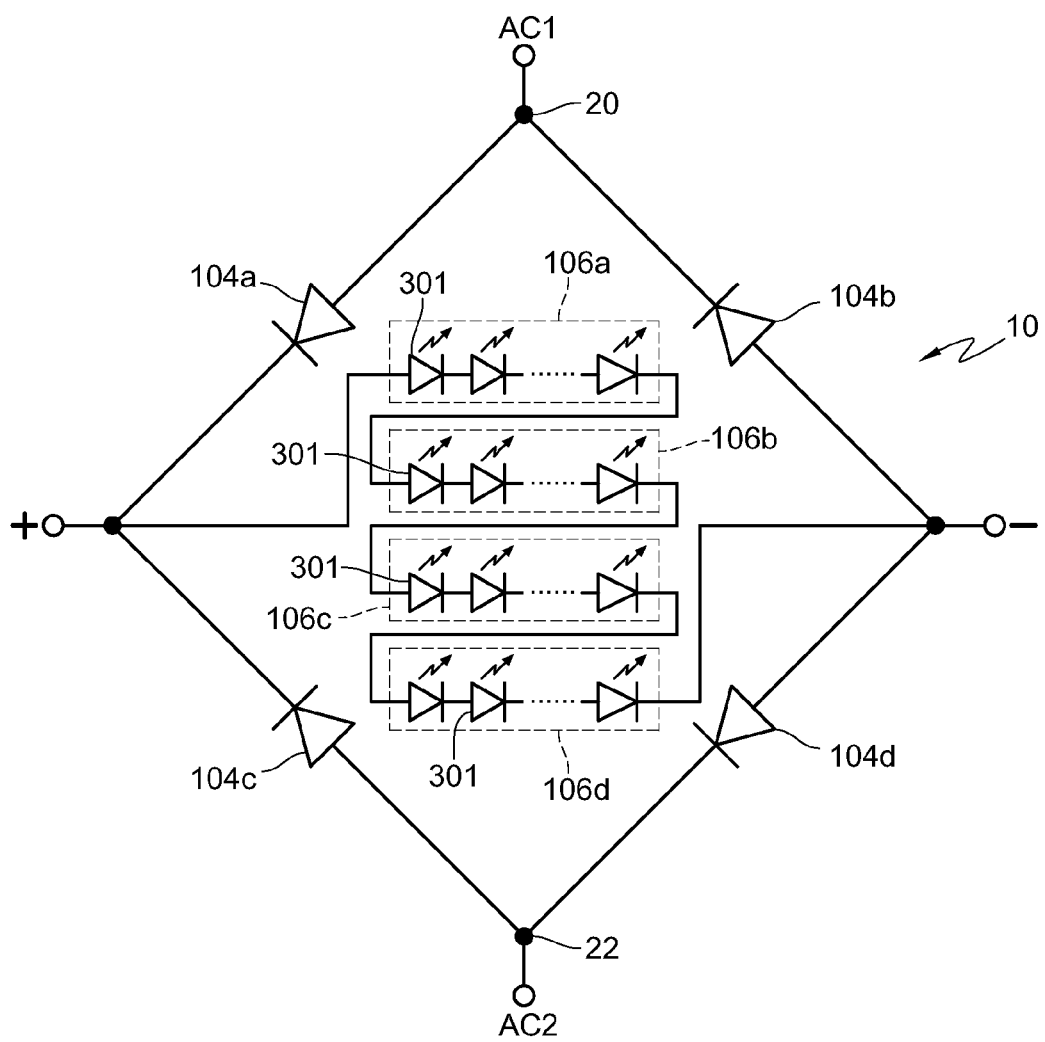
FIG. 3A is an equivalent circuit diagram of the light emitting device in FIG. 1B having LEDs connected in series.
Figure 3B:
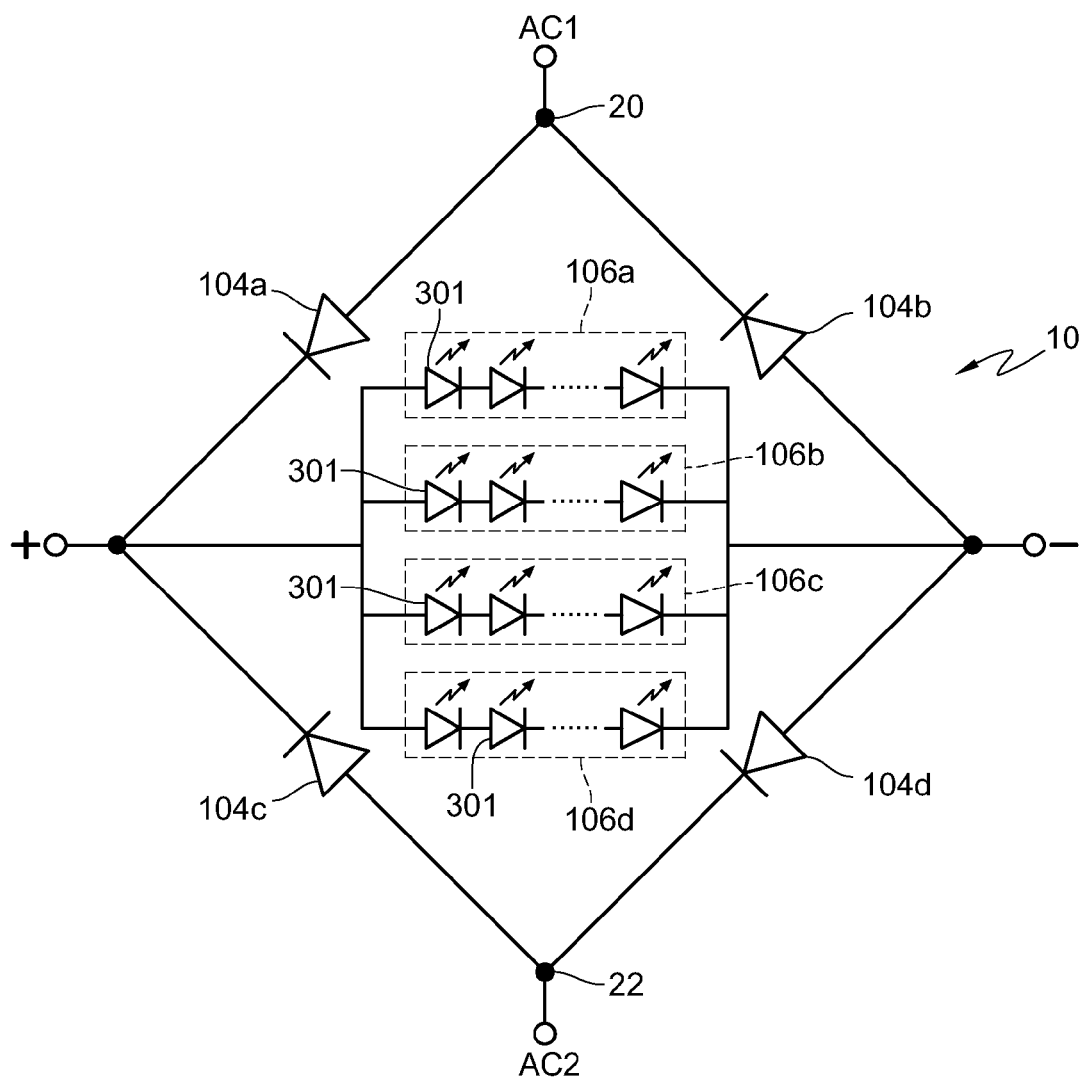
FIG. 3B is an equivalent circuit diagram of the light emitting device in FIG. 1B having LEDs connected in parallel.

Referring to FIGS. 3A and 3B together, a first AC node 20 is disposed between the first rectifier diode 104a and the second rectifier diode 104b, a second AC node 22 is disposed between the third rectifier diode 104c and the fourth rectifier diode 104d, and the first AC node 20 and the second AC node 22 are used for adapting an AC power supply (that is, an AC1 and an AC2 in FIGS. 3A and 3B). The AC power supply may be, but is not limited to, 110 V or 220 V. When the AC power supply forms a positive half cycle, the first rectifier diode 104a, the first LED module 106a, the second LED module 106b, the third LED module 106c, the fourth LED module 106d, and the fourth rectifier diode 104d form a first conductive path. When the AC power supply forms a negative half cycle, the second rectifier diode 104b, the first LED module 106a, the second LED module 106b, the third LED module 106c, the fourth LED module 106d, and the third rectifier diode 104c form a second conductive path.

Next, as shown in FIGS. 2B and 2C, a first middle conductive wire layer 24a located at the middle layer connects the first rectifier diode 104a and the second rectifier diode 104b through the fourth via 30d, and a second middle conductive wire layer 24b connects the third rectifier diode 104c and the fourth rectifier diode 104d through the third via 30c.

A first top conductive wire layer 26a, a second top conductive wire layer 26b, a third top conductive wire layer 26c, and a fourth top conductive wire layer 26d located at the top layer are used for connecting the LED modules. Particularly, the first top conductive wire layer 26a connects the first LED module 106a and the third LED module 106c, the second top conductive wire layer 26b connects the second LED module 106b, the second rectifier diode 104b, and the fourth rectifier diode 104d, the third top conductive wire layer 26c connects the third LED module 106c, the first rectifier diode 104a, and the third rectifier diode 104c, and the fourth top conductive wire layer 26d connects the second LED module 106b and the fourth LED module 106d.

According to the embodiments of the disclosure, the first rectifier diode 104a is connected to the second rectifier diode 104b in series, and the third rectifier diode 104c is connected to the fourth rectifier diode 104d in series.

Therefore, FIGS. 3A and 3B are equivalent circuit diagram of the light emitting device in FIG. 1B, in which the first rectifier diode 104a, the second rectifier diode 104b, the third rectifier diode 104c, and the fourth rectifier diode 104d are used for rectifying the AC power supply into the DC power supply, to drive the LED modules between the first rectifier diode 104a and the fourth rectifier diode 104d, and the LED modules between the second rectifier diode 104b and the third rectifier diode 104c to emit light. Each LED module (the first LED module 106a, the second LED module 106b, the third LED module 106c, and the fourth LED module 106d) comprises a plurality of LEDs 301, and the LEDs 301 can be selectively connected to one another in series (as shown in FIG. 3A) or in parallel (as shown in FIG. 3B).

The LEDs 301 in the first LED module 106a, the second LED module 106b, the third LED module 106c, and the fourth LED module 106d are not limited to be electrically connected successively in series or in parallel. According to an embodiment of the disclosure, the LEDs 301 may also be partially connected in parallel and partially connected in series, so as to facilitate the advantage of flexibility of the light emitting device in fabrication. Secondly, when each LED module comprises 20 to 30 LEDs 301, and each LED 301 can be used to endure a reverse biased voltage being higher than 3 V, the withstand voltage of the light emitting device 10 of the disclosure can be effectively increased to be higher than 90 V. Thus, compared with conventional illuminating devices, the light emitting device 10 has a higher payload, thereby reducing the fabrication cost of the circuit of the light emitting device invisibly.

Figure 4A:
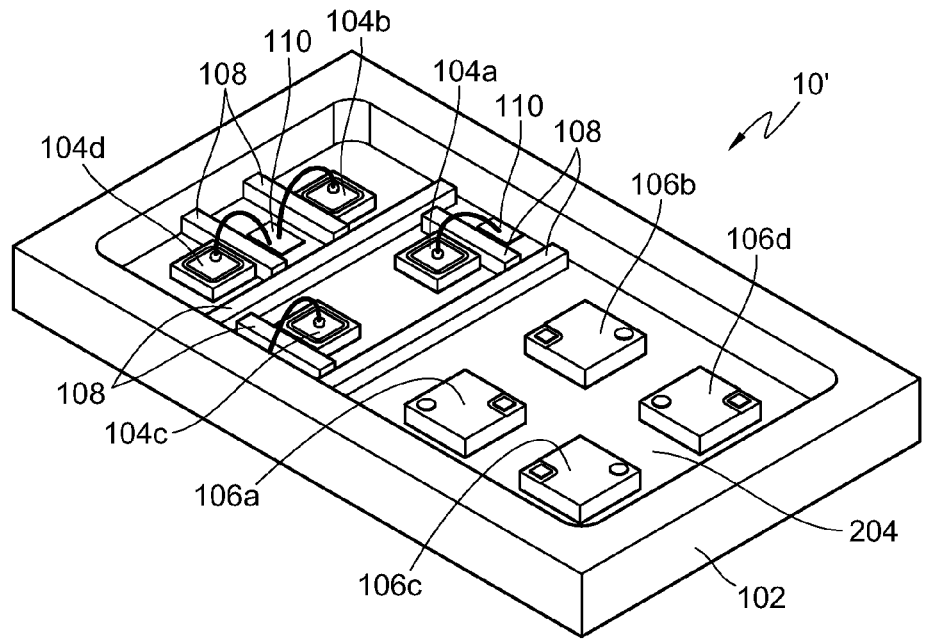
FIG. 4A is a schematic structural view of a light emitting device according to another embodiment of the disclosure.
Figure 4B:
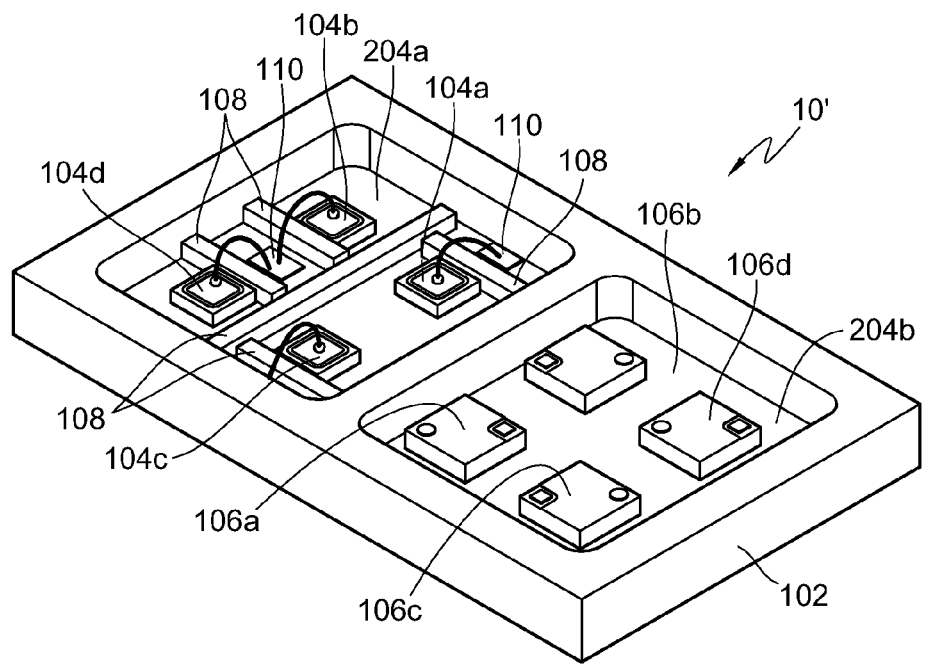
FIG. 4B is a schematic structural view of a light emitting device according to another embodiment of the disclosure.
Figure 5A:
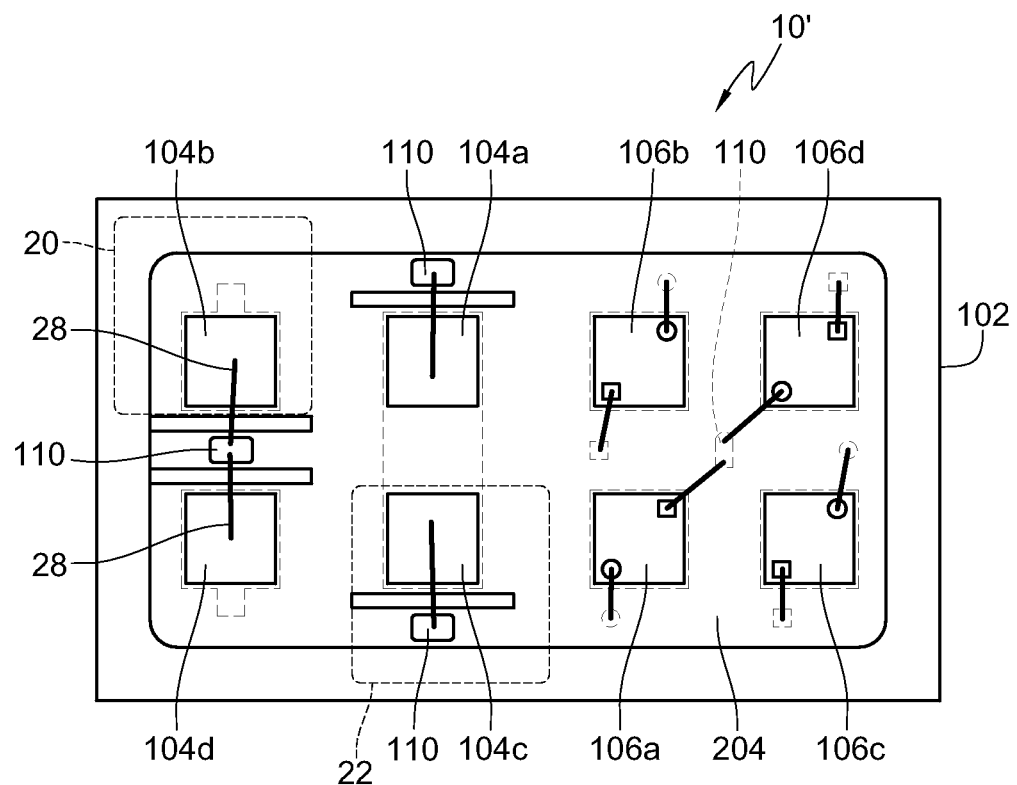
FIG. 5A is a schematic layout view of bottom conductive wire layers of the light emitting device in FIG. 4A.
Figure 5B:
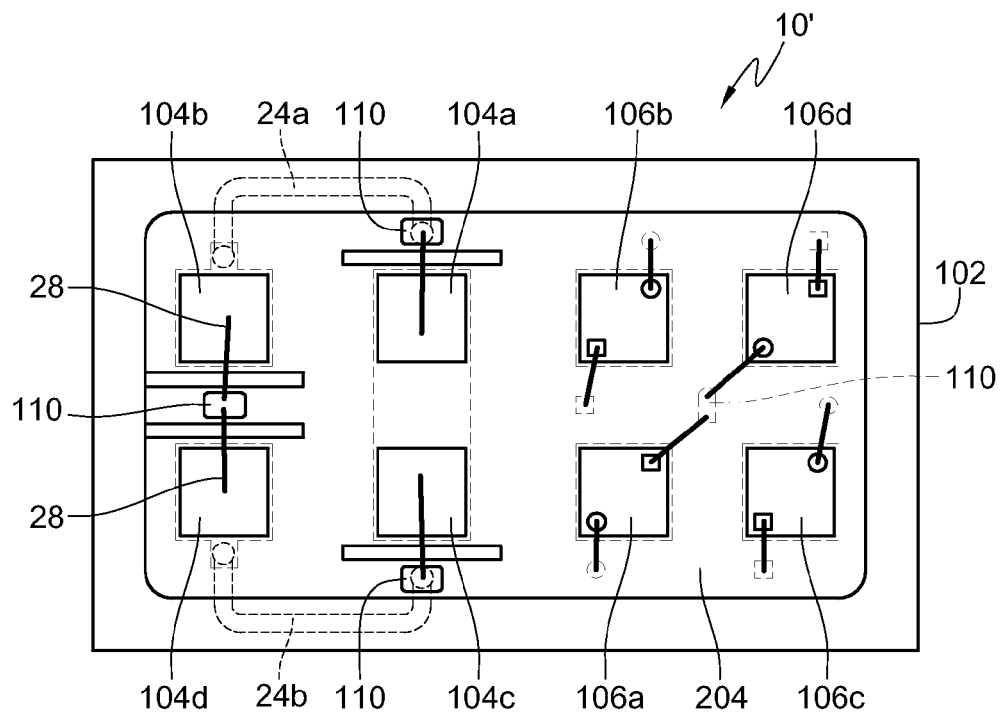
FIG. 5B is a schematic layout view of middle conductive wire layers of the light emitting device in FIG. 4A.
Figure 5C:
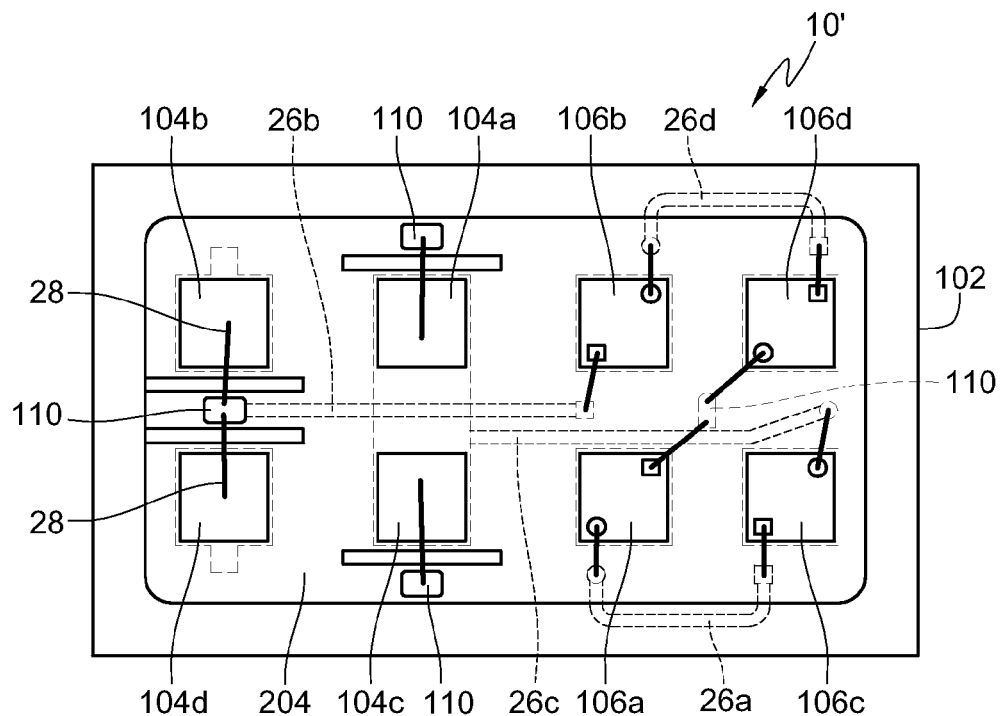
FIG. 5C is a schematic layout view of top conductive wire layers of the light emitting device in FIG. 4A.

FIG. 4A is a schematic structural view of a light emitting device according to another embodiment of the disclosure. A light emitting device 10' comprises a substrate 102, a first rectifier diode 104a, a second rectifier diode 104b, a third rectifier diode 104c, a fourth rectifier diode 104d, a first LED module 106a, a second LED module 106b, a third LED module 106c, and a fourth LED module 106d. As for the conductive wires and the electrical connection relationship between the rectifier diodes (the first rectifier diode 104a, the second rectifier diode 104b, the third rectifier diode 104c, and the fourth rectifier diode 104d) and the LED modules (the first LED module 106a, the second LED module 106b, the third LED module 106c, and the fourth LED module 106d), reference is made to FIGS. 5A to 5C together, which is the same as that described in FIGS. 2A to 2C in the foregoing embodiment, and will not be repeated herein. The only difference lies in that in the light emitting device 10' according another embodiment of the disclosure, the rectifier diodes and the LED modules are configured in a cavity 204 on the substrate 102 together, and are separated by an isolation part 108. Thus, the light emitting device 10' rectifies the AC power supply into DC power supply through the first rectifier diode 104a, the second rectifier diode 104b, the third rectifier diode 104c, and the fourth rectifier diode 104d, to drive the first LED module 106a, the second LED module 106b, the third LED module 106c, and the fourth LED module 106d to emit light, to achieve the purpose of the disclosure Secondly, the rectifier diodes and the LED modules are not limited to be disposed in the same cavity on the substrate 102. According to an embodiment of the disclosure, as shown in FIG. 4B, the cavity 204 may be divided into a first sub-cavity 204a and a second sub-cavity 204b, for accommodating the rectifier diodes and the LED modules respectively. That is to say, in this embodiment, the first sub-cavity 204a is defined as a first configuration area, for accommodating the first rectifier diode 104a, the second rectifier diode 104b, the third rectifier diode 104c, and the fourth rectifier diode 104d. The second sub-cavity 204b is defined as a second configuration area, for accommodating the first LED module 106a, the second LED module 106b, the third LED module 106c, and the fourth LED module 106d. Through the configuration, the first rectifier diode 104a, the second rectifier diode 104b, the third rectifier diode 104c, and the fourth rectifier diode 104d are used for rectifying the AC power supply into DC power supply, to drive the first LED module 106a, the second LED module 106b, the third LED module 106c, and the fourth LED module 106d to emit light.

The light emitting devices 10' in FIGS. 4A and 4B have the isolation part 108 for separating the first rectifier diode 104a, the second rectifier diode 104b, the third rectifier diode 104c, and the fourth rectifier diode 104d at the electrical contact 110, and as for the connection mode, reference is made to FIG. 1C. In an embodiment, the material of the isolation part 108 may be, for example, $SiO_2$. As the oxidation process performed on the substrate 102 is a technique well known to persons skilled in the art, the fabrication steps of the light emitting device 10' can be simplified, and the fabrication cost can also be further reduced.

Figure 6A:
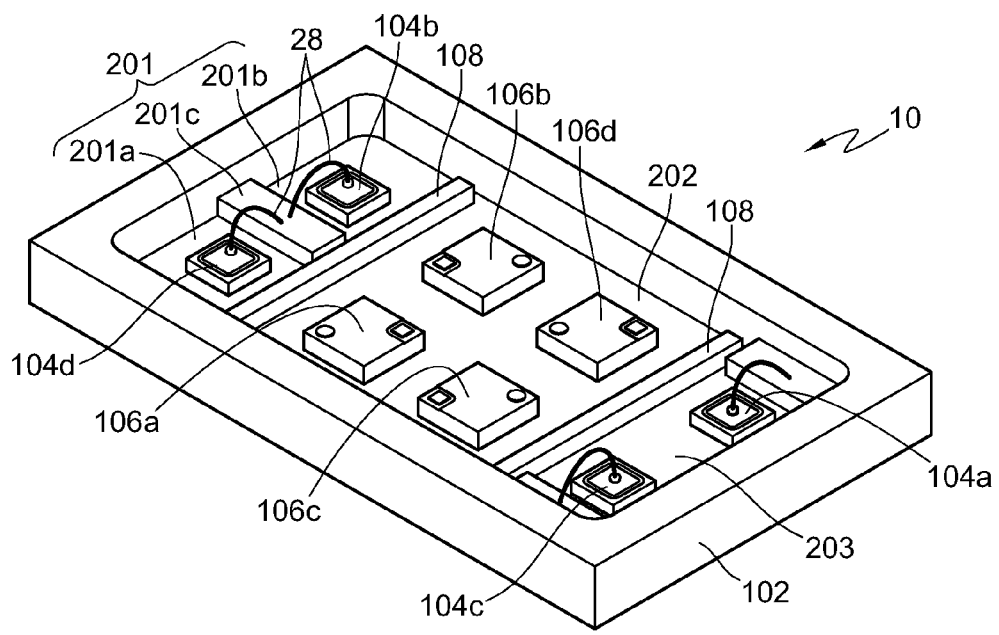
FIG. 6A is a schematic structural view of a light emitting device according to another embodiment of the disclosure.
Figure 6B:
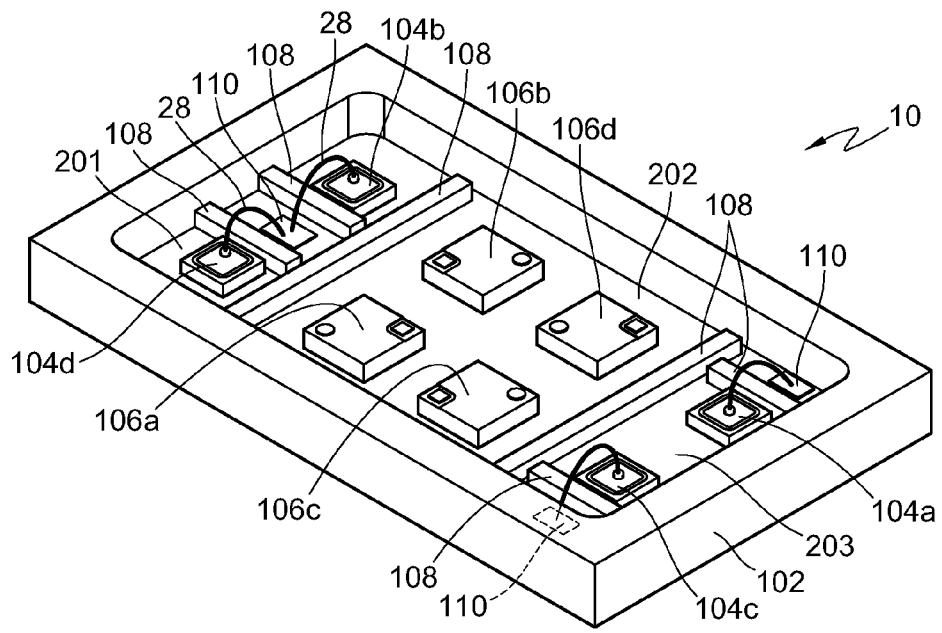
FIG. 6B is a schematic structural view of a light emitting device according to another embodiment of the disclosure.

Similarly, in the light emitting device 10 in FIGS. 1B to 1C, the cavities formed on the substrate 102 through an etching step can be replaced by the isolation part 108 formed through simple fabrication steps, and as for the schematic views, reference is made to FIGS. 6A and 6B. In the embodiment in FIGS. 6A and 6B, the rectifier diodes and the LED modules are only separated by a plurality of isolation parts 108, and thus the etching step for forming the cavities is omitted, and the purpose of the disclosure can be achieved.

Furthermore, generally, as the DC output after being rectified by the rectifier diodes is not a constant DC voltage. Therefore, in order to rectify the AC power supply to generate a stable DC, in a light emitting device according to another embodiment, one or more filter circuits can be configured, to reduce ripples of the AC power supply, so as to smooth the output voltage. In an embodiment, a capacitor capable of storing electric energy is selectively added to an output end of the rectifier diode in the filter circuit, in which the capacitor is generally referred to as a filter capacitor or a smoothing capacitor, to stabilize an output voltage after voltage stabilization and rectification.

In view of the above, according to the light emitting device of the disclosure, the AC power supply is rectified into the DC power supply through the rectifier diodes, to drive the LEDs to emit light. In the light emitting device of the disclosure, the rectifier diodes and the LEDs are disposed in the different cavities on the substrate respectively, to improve the voltage withstand degree of the entire light emitting device.

Secondly, in the light emitting device of the disclosure, the LEDs are not limited to be connected in series or in parallel, such that each LED module may comprise a plurality of LEDs, so the withstand voltage of the light emitting device is effectively improved accordingly.

According to the light emitting device of the disclosure, in actual applications, the designer can selectively omit the fabrication step of the cavities, and directly dispose the rectifier diodes and the LED modules on the substrate, which are separated by the isolation wall. Such a method can also achieve the purpose of the disclosure, however, in embodiments of this type, when the light emitting device enters a subsequent packaging stage, other specific fabrication steps are needed to complete the packaging of the package.

What is claimed is:

1. A light emitting device, comprising:
   a substrate having a first cavity, a second cavity, and a third cavity formed thereon;
   a via arranged in the second cavity and penetrating the substrate;
   a plurality of rectifier diodes arranged in the first cavity and the third cavity; and
   a light emitting diode (LED) module arranged in the second cavity and comprising a plurality of LEDs.

2. The light emitting device according to claim 1, wherein the plurality of LEDs electrically connected in series or in parallel.

3. The light emitting device according to claim 1, wherein the first cavity or the third cavity further comprises a plurality of sub-cavities for accommodating the plurality of rectifier diodes.

4. The light emitting device according to claim 3, further comprising one or more protruding portions to define the sub-cavities.

5. The light emitting device according to claim 3, further comprising one or more isolation parts to define the sub-cavities.

6. The light emitting device according to claim 5, wherein the isolation parts comprises silica ($SiO_2$).

7. The light emitting device according to claim 1, further comprising a package resin filled in the first, second, and third cavities.

8. The light emitting device according to claim 1, wherein the substrate comprises a low-temperature cofired ceramic (LTCC).

9. The light emitting device according to claim 1, wherein the rectifier diodes comprise a first rectifier diode, a second rectifier diode, a third rectifier diode, and a fourth rectifier diode; the first rectifier diode is electrically connected to the second rectifier diode in series, the third rectifier diode is electrically connected to the fourth rectifier diode in series.

10. The light emitting device according to claim 9, wherein the LED module comprises a first LED module, a second LED module, a third LED module, and a fourth LED module, the first LED module is electrically connected to the third LED module, the second LED module is electrically connected to the fourth LED module, the second rectifier diode, and the fourth rectifier diode, and the third LED module is electrically connected to the first LED module, the first rectifier diode, and the third rectifier diode.

11. The light emitting device according to claim 10, further comprising a bottom conductive wire layer, top conductive wire layer, and a middle conductive wire layer in the substrate.

* * * * *